United States Patent
Barrieau et al.

(10) Patent No.: US 9,361,785 B2
(45) Date of Patent: Jun. 7, 2016

(54) SYSTEM AND METHOD FOR TESTING BATTERY BACKUP CAPACITIES IN ALARM SYSTEMS

(71) Applicant: Tyco Fire & Security GmbH, Neuhausen am Rheinfall (CH)

(72) Inventors: Mark Philias Barrieau, Baldwinville, MA (US); Daniel Paul Cianfrocco, Worcester, MA (US)

(73) Assignee: TYCO FIRE & SECURITY GMBH, Neuhausen am Rheinfall (CH)

( * ) Notice: Subject to any disclaimer, the term of this patent is extended or adjusted under 35 U.S.C. 154(b) by 113 days.

(21) Appl. No.: 14/173,485

(22) Filed: Feb. 5, 2014

(65) Prior Publication Data

US 2015/0221211 A1    Aug. 6, 2015

(51) Int. Cl.
*G08B 29/00* (2006.01)
*G08B 29/18* (2006.01)
*G01R 31/36* (2006.01)

(52) U.S. Cl.
CPC .......... *G08B 29/181* (2013.01); *G01R 31/3627* (2013.01)

(58) Field of Classification Search
CPC ..................................................... G08B 29/181
USPC .................. 340/514, 506, 660, 679; 320/137
See application file for complete search history.

(56) References Cited

U.S. PATENT DOCUMENTS

| | | | | |
|---|---|---|---|---|
| 4,972,181 A | * | 11/1990 | Fiene | 340/636.16 |
| 5,661,463 A | * | 8/1997 | Letchak et al. | 340/636.15 |
| 6,459,173 B1 | * | 10/2002 | Gunsaulus | H02J 9/06 307/18 |
| 7,459,881 B2 | * | 12/2008 | Barrieau | 320/103 |
| 8,063,763 B2 | * | 11/2011 | Barrieau et al. | 340/514 |
| 2008/0266076 A1 | * | 10/2008 | Barrieau et al. | 340/506 |
| 2009/0009352 A1 | * | 1/2009 | Savage et al. | 340/663 |
| 2010/0194576 A1 | * | 8/2010 | Bertness | G01R 31/3627 340/636.1 |

* cited by examiner

*Primary Examiner* — Phung Nguyen

(57) ABSTRACT

A system and method for testing the capacities of battery backups in alarm systems. The system may include an alarm panel, a notification device connected to the alarm panel, a battery backup connected to the alarm panel and configured to provide the alarm panel and the notification appliance with electrical power. The system may further include test circuitry that is configured to monitor a voltage and an output current of the battery backup when the battery backup is placed under a battery capacity test, and a system controller that is configured to determine, from the monitored voltage and output current of the battery backup, information relating to the capacity of the battery backup. Such information may be communicated to a workstation or an offsite monitoring facility where it may be compiled with information relating to the capacities of other battery backups in the alarm system to create a report.

18 Claims, 3 Drawing Sheets

SYSTEM AND METHOD FOR TESTING BATTERY BACKUP CAPACITIES IN ALARM SYSTEMS

FIELD OF THE DISCLOSURE

The disclosure relates generally to the field of alarm systems, and more particularly to an improved system and method for testing the capacities of battery backups in alarm systems.

BACKGROUND OF THE DISCLOSURE

Alarm systems, such as fire alarm systems, typically include a plurality of notification appliances (e.g. horn/strobe units) installed throughout a monitored building that are configured to be activated upon the detection of an alarm condition, such as the presence of fire or smoke. Occupants of the building may thereby be notified of a potentially hazardous condition and may evacuate the building or take other appropriate action. It is therefore important that the components of alarm systems always be in good working order. To that end, fire alarm codes and regulations require that fire alarm systems be provided with a secondary power source, such as a rechargeable battery or a set of rechargeable batteries (commonly referred to as a "battery backup") capable of providing power for a predetermined amount of time if an alarm system's primary power source experiences an outage.

The capacity of a battery backup may decline as a battery ages. Such degradation of capacity may result from environmental conditions, over-discharge, and/or mishandling of a battery, for example. It is therefore necessary to periodically test the capacities of battery backups in alarm systems to ensure that a sufficient amount of backup power can be provided to system components when necessary. Most jurisdictions require that battery backups be tested annually, and that during such testing it be demonstrated that a battery backup has adequate capacity to provide respective alarm system components (e.g., alarm panels, notification devices, etc.) with sufficient electrical power to sustain a standby period of 24 hours followed by an alarm period of at least 5 minutes.

Several methods have been developed for testing the capacities of battery backups in alarm systems. One method, which may be referred to as a "live test," involves switching an alarm system from a primary AC power source to a battery backup power source for a standby period of predetermined length (e.g., 24 hours), followed immediately by placing the notification appliances in the alarm system in an alarm mode for an alarm period of predetermined length (e.g., 5 minutes). The notification appliances are physically observed during the alarm period and the voltage output of each battery backup is measured at the end of the alarm period to verify sufficient capacity. One shortcoming of this live test method is that it requires personnel to simultaneously monitor all of the notification appliances in an alarm system and to simultaneously measure the output of all of the batteries in an alarm system during and after the alarm period. This can be very burdensome and expensive since many personnel are required to test systems that have large numbers of notification appliances installed in locations that are remote from one another.

Another test method, which may be referred to as an "offline test," involves removing battery backups from an alarm system and discharging them in on a bench, such as at an offsite test facility, in order to determine the capacities of the battery backups. As will be appreciated, a shortcoming of this method is that an alarm system must be operated without battery backups during the testing period which poses a safety hazard. Moreover, offline discharging may only provide an approximation of a battery backup's true operational (i.e. online) capacity.

SUMMARY

In view of the foregoing, it would be advantageous to provide a convenient, cost-effective system and method for measuring and reporting the capacities of battery backups in an alarm system without requiring simultaneous observation and/or measurement of alarm system components and without requiring the battery backups to be removed from the alarm system.

An exemplary system for testing battery backup capacity in an alarm system in accordance with the present disclosure may include an alarm panel, a notification device operatively connected to the alarm panel, and a battery backup operatively connected to the alarm panel and configured to provide the alarm panel and the notification appliance with electrical power. The system may further include test circuitry within the alarm panel that is configured to monitor a voltage and an output current of the battery backup when the battery backup is placed under a battery capacity test, and a system controller within the alarm panel that is configured to determine, from the monitored voltage and output current of the battery backup, information relating to the capacity of the battery backup. Such information may be communicated to a workstation or an offsite monitoring facility where it may be compiled with information relating to the capacities of other battery backups in the alarm system to create a report.

An exemplary method for testing the capacity of a battery backup in an alarm system in accordance with the present disclosure may include the steps of switching an alarm panel and a corresponding notification appliance from a primary power source to the battery backup for a predetermined period, monitoring a voltage and an output current of the battery backup, determining, from the monitored voltage and output current of the battery backup, information relating to the capacity of the battery backup, and compiling the information relating to the capacity of the battery backup with information relating to the capacities of other battery backups in the alarm system to create a report.

An exemplary method for performing an automatic battery capacity test in an alarm system in which a plurality of battery backups are configured to provide respective alarm panels and notification appliances with electrical power in accordance with the present disclosure may include the steps of automatically switching the alarm panels and corresponding notification appliances from respective primary power sources to their respective battery backups for a predetermined period, automatically monitoring a voltage and an output current of each battery backup with test circuitry residing in each of the alarm panels, automatically determining, from the monitored voltages and output currents of the battery backups, information relating to the capacities of the battery backups, and compiling the information relating to the capacities of the battery backups to create a report.

DETAILED DESCRIPTION

Figure 1:
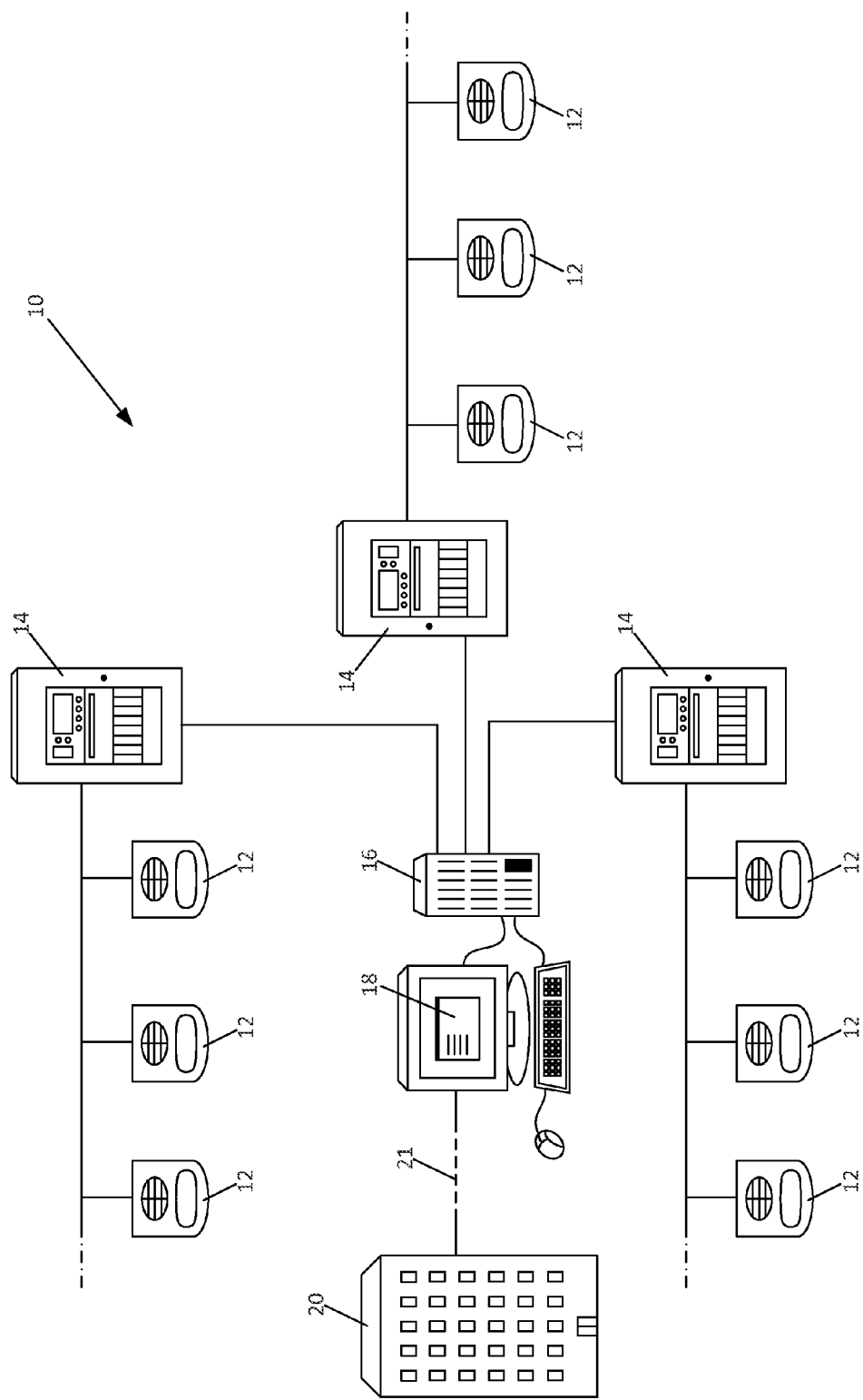
FIG. 1 is a schematic diagram illustrating an exemplary embodiment of an alarm system in accordance with the present disclosure.

A system and method for testing the capacities of battery backups in alarm systems in accordance with the present disclosure will now be described more fully hereinafter with reference to the accompanying drawings, in which preferred embodiments of the disclosure are shown. It will be appreciated that the disclosed system and method may be embodied in many different forms and should not be construed as being limited to the embodiments set forth herein. Rather, these embodiments are provided so that this disclosure will be thorough and complete, and will fully convey the scope of the invention to those skilled in the art. In the drawings, like numbers refer to like elements throughout.

It will be appreciated by those of ordinary skill in the art that the system and method described herein may be implemented in virtually any type of alarm or monitoring system that employs battery backups, including, but not limited to, fire alarm systems, burglar alarm systems, surveillance systems, air quality monitoring systems, inventory monitoring systems, etc., or any combination thereof, such as may be provided for detecting an alarm event (e.g. a security breach) or a warning condition (e.g. an elevated temperature) in a building, structure, enclosure, or area. Many other applications are contemplated and may be implemented without departing from the scope of the present disclosure. For ease of description, all such applications are collectively referred to herein as "alarm systems."

Referring to FIG. 1, an exemplary alarm system 10 in accordance with the present disclosure is shown. The alarm system 10 may include a plurality of notification appliances 12 that may be installed throughout a monitored structure and connected to respective alarm panels 14. Each notification appliance 12 may be associated with a unique address within the alarm system 10 for facilitating identification thereof and enabling selective routing of command/control signals through the alarm panels 14 to each of the notification appliances 12. The notification appliances 12 may be configured to provide notifications of alarm conditions (e.g., fire, smoke, etc.) within the structure, wherein such alarm conditions may be detected by initiating devices (e.g., pull stations, smoke detectors, not shown) within the alarm system 10. The notification appliances 12 shown in FIG. 1 are illustrated as being strobe/horn units, but it is contemplated that other varieties of notification appliances, such as sirens, bells, buzzers, etc., may additionally or alternatively be implemented in the alarm system 10 in a similar manner. For the sake of convenience and clarity, only three alarm panels 14 are shown, but it is to be understood that the alarm system 10 may include greater or fewer alarm panels 14 and corresponding notification appliances 12 without departing from the scope of the present disclosure.

The exemplary alarm system 10 may also include a workstation 16, such as a personal computer (PC) or server, operatively connected to the alarm panels 14. The workstation 16 may be loaded with one or more software applications that provide human operators of the system 10 with a user interface 18 for monitoring and controlling certain aspects of the alarm system 10. For example, the user interface 18 may allow an operator to observe the functional status of the notification appliances 12, and to activate, deactivate, test, inspect, or otherwise exert control over the notification appliances 12 as further described below. Alternatively, it is contemplated that the workstation 16 and user interface 18 may be entirely omitted from the alarm system 10, and that an operator may activate, deactivate, test, inspect, observe the functional status of, or otherwise exert control over the notification appliances 12 via the alarm panels 14.

The alarm system 10 may be in communication with an offsite monitoring facility 20, such as via a direct or indirect wired or wireless network connection 21 between the offsite monitoring facility 20 and the workstation 16 (as shown in FIG. 1) or between the offsite monitoring facility 20 and each of the alarm panels 14. Personnel at the offsite monitoring facility 20 may thereby monitor, control, and/or test the components of the alarm system 10 from a remote location without having to physically visit the monitored site.

Figure 2:
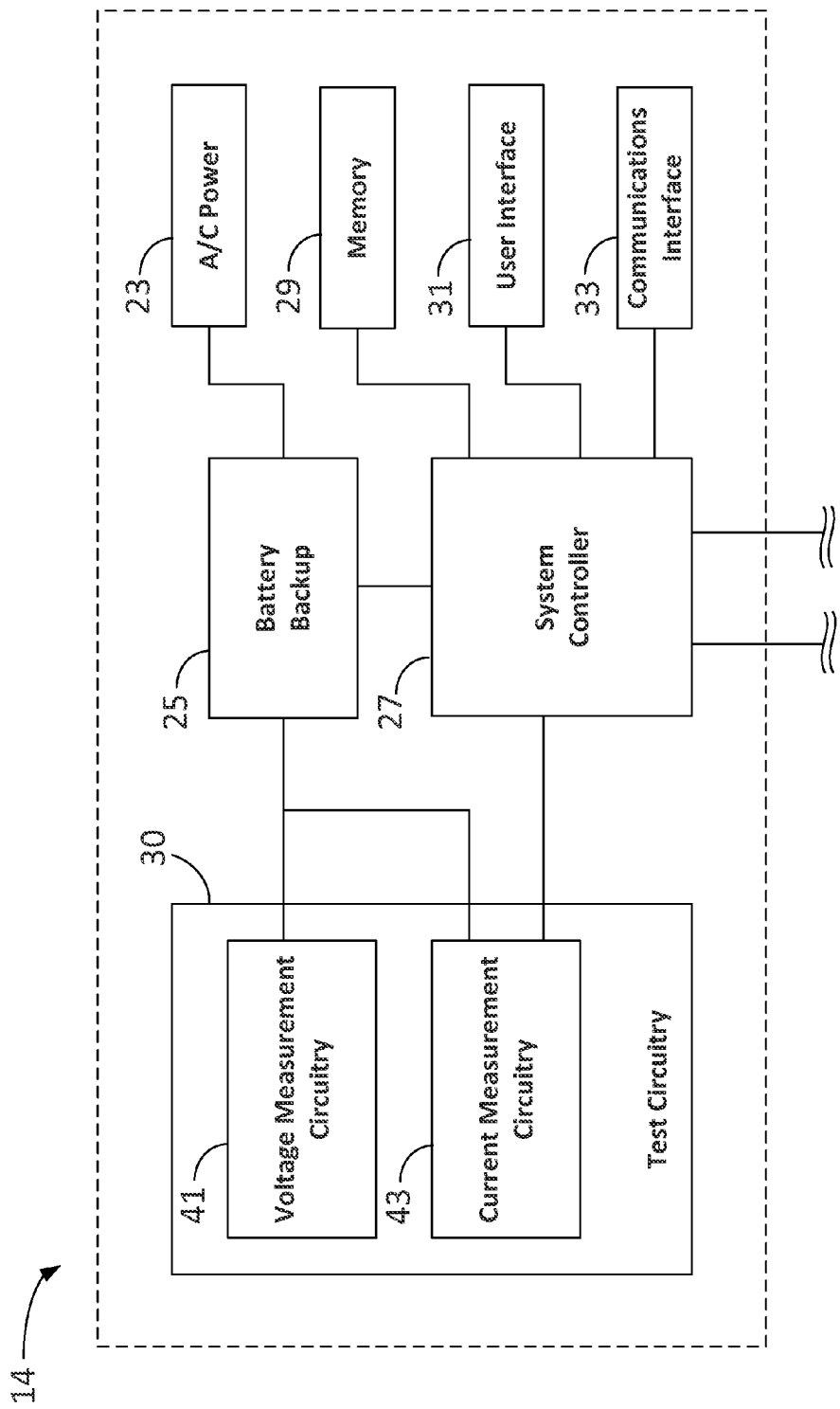
FIG. 2 is a schematic diagram illustrating an exemplary alarm panel in accordance with the present disclosure.

Referring to FIG. 2, a schematic diagram of an exemplary one of the alarm panels 14 is shown. It will be appreciated that the illustrated alarm panel 14 may be representative of some or all of the alarm panels 14 in FIG. 1. The alarm panel 14 may include a primary AC power source 23 as well as a secondary battery backup power source 25 (hereinafter "battery backup 25") that may provide electrical power to the alarm panel 14 as well as to components of the alarm system 10 connected to the alarm panel 14. The battery backup may 25 may be any type of rechargeable battery that is suitable for providing the alarm panel 14 and connected system components with adequate electrical power. In one non-limiting embodiment, the battery backup 25 may be a sealed lead acid battery.

The alarm panel 14 may further include a system controller 27 that facilitates control and supervision of initiating devices (not shown) and notification appliances (see FIG. 1) that are connected to the alarm panel 14, wherein such control and supervision may be performed in an predetermined (e.g., preprogrammed) manner, or in response to manual input at the alarm panel 14 or at the workstation 16 (see FIG. 1). The system controller 27 may also be configured to dictate, such as via hardware and/or software switching mechanisms and in response to automatic or manual input, whether the alarm panel 14 receives power from the AC power source 23 or from the battery backup 25 as further described below. The alarm panel 14 may further include elements such as a memory 29, a user interface 31, and a wired or wireless communications interface 33 for facilitating communication with the workstation 16 and/or the offsite monitoring facility 20, for example.

Still referring to FIG. 2, the alarm panel 14 may be provided with test circuitry 30 configured to monitor the discharge rate of the battery backup 25 when the battery backup 25 is used to power the alarm panel 14 and the connected system components (e.g., the notification appliances 12 shown in FIG. 1), such as when the battery backup 25 is placed under test as further described below. The test circuitry 30 may include a current measurement circuit 41 and a voltage measurement circuit 43 that may produce respective analog output signals that may be converted into digital input signals by the system controller 27. When the battery backup 25 is discharged, the system controller 27 may monitor the voltage and output current of the battery backup 25 over time via the test circuitry 30 to determine the capacity of the battery backup 25, such as in ampere-hours. The measured capacity may then be logged, such as in the memory 29, and may be communicated to the workstation 16 and/or the offsite monitoring facility 20 for recordation and review. Test software may be stored in the memory 29 and may be executed by the system controller 27 for performing any calculations desired for determining the capacity of the battery backup 25 and for issuing notifications related thereto. For example, if it is determined that the capacity of the battery backup 25 has fallen below a predetermined minimum capacity value, a fault condition can be logged and an alert can be issued. A battery backup 25 that has been determined to have a capacity below such a predetermined minimum capacity value may thereby be identified and service personnel may be notified that the battery backup 25 is defective or is nearing the end of its useful life.

Figure 3:
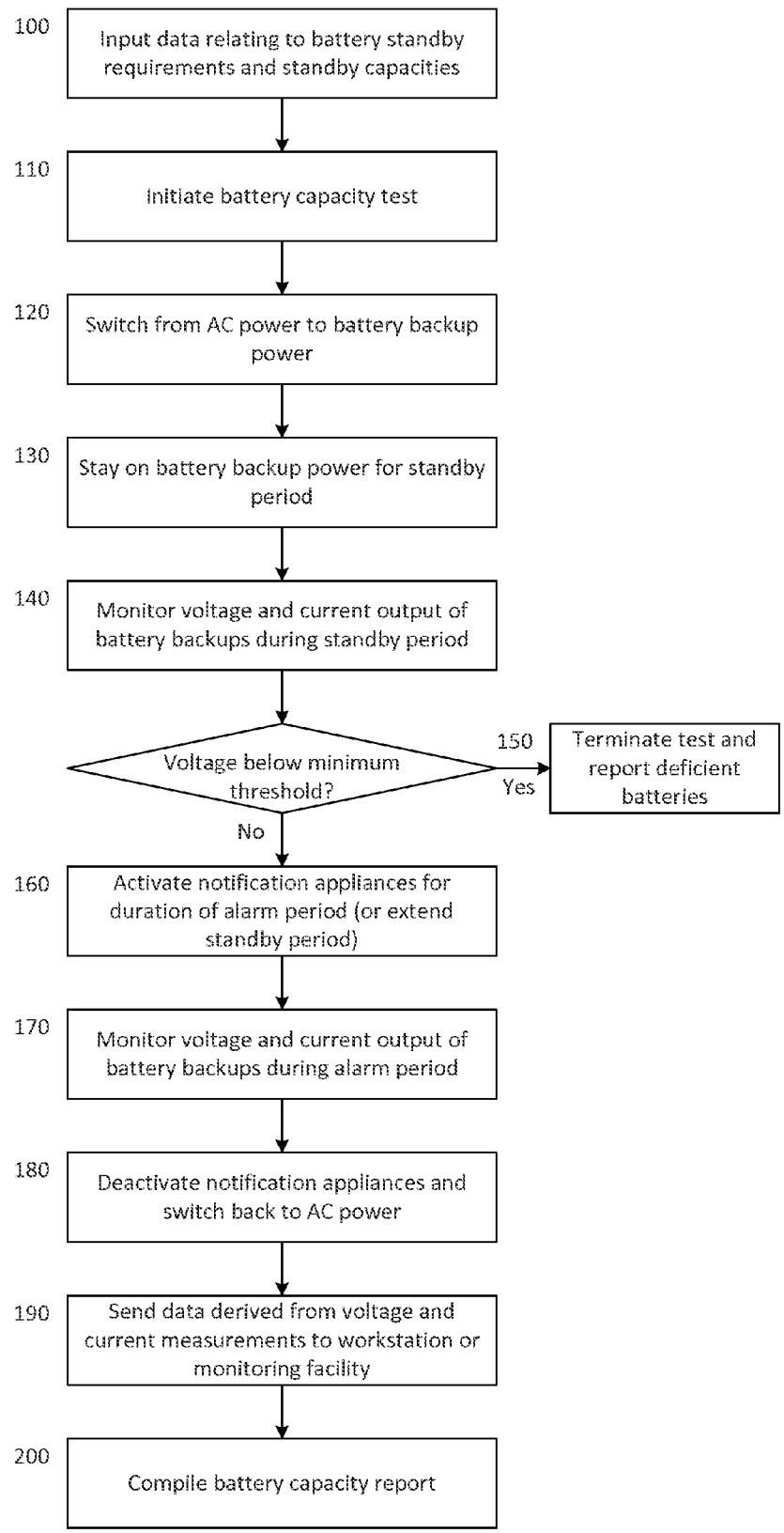
FIG. 3 is a flow diagram illustrating an exemplary embodiment of a method in accordance with the present disclosure.

Referring to FIG. 3, a flow diagram illustrating an exemplary method for testing the capacities of battery backups in an alarm system in accordance with the present disclosure is illustrated. The method will now be described in detail in conjunction with the schematic representations of the alarm system 10 shown in FIG. 1 and the alarm panel 14 shown in FIG. 2.

At a first step 100 of the exemplary testing method, data relating to battery standby requirements and battery capacities may be input into the alarm system 10. For example, such data may include a predetermined standby period duration and a predetermined alarm period duration that each battery backup 25 in the alarm system 10 is required to provide backup power for, as well as data relating to the rated capacity of each battery backup 25 in the alarm system 10. This data may be stored in memory in one or more of the workstation 16, the offsite monitoring facility 20, and each of the respective alarm panels 14.

At step 110 of the exemplary method, a battery capacity test of the alarm system 10 may be initiated. Such a test may be initiated automatically, such as by software programmed to perform the test according to a predetermined schedule (e.g., annually), or manually via operator input at the panel 14, workstation 16 or at the offsite monitoring facility 20. Upon initiation of the battery capacity test, the system controllers 27 of the alarm panels 14 may, at step 120, switch from utilizing their respective AC power sources 23 to utilizing their respective battery backups 25. The alarm panels 14 and the system components that are connected to the alarm panels 14, including the notification appliances 12 of the alarm system 10, may thereafter draw electrical power solely from the respective battery backups 25 for the remainder of the battery capacity test.

At step 130 of the exemplary method, the test software (described above) may instruct the system controllers 27 to keep the alarm panels 14 on battery backup power for a predetermined standby period. The standby period may have a minimum duration that may be dictated by local requirements. In one non-limiting example, the standby period may have duration of 24 hours. It will be appreciated by those of ordinary skill in the art that the duration of the standby period may vary depending on the particular type of alarm system 10 and the jurisdiction in which the alarm system 10 is located.

At step 140 of the exemplary method, the test circuits 30 of the alarm panels 14 may monitor the voltages and output currents of the battery backups 25 during the standby period and may determine the capacities and discharge rates of the battery backups 25 in the manner described above. In some embodiments the voltages and output currents are continually monitored during the test period. In other embodiments, the voltages and output currents are periodically sampled at regular intervals during the test period. If it is determined that the voltage and/or output current of any of the battery backups 25 falls below a predetermined threshold voltage, the battery capacity test may, at step 150, be terminated, and the system controllers 27 may switch the alarm panels 14 back to their AC power sources 23. Alternatively, the system controllers 27 may switch only that alarm panel 14 having the battery backup 25 with a lower than threshold voltage and/or output current to its AC power source 23, leaving the remaining alarm panels 14 in test mode. The deficient battery or batteries may be reported to the workstation 16 and/or the offsite monitoring facility 20 so that they may be repaired or replaced. The minimum threshold voltage of each battery may be a preprogrammed, default value or may be calculated from the battery data entered in step 100, for example.

At the completion of the standby period, the system controllers 27 may, at step 160 initiate an alarm condition, whereby the notification appliances 12 of the alarm system 10 are activated. The alarm condition may be maintained for an alarm period of predetermined duration. As with the standby period, the alarm period may have a minimum duration that may be dictated by government-issued testing guidelines. In one non-limiting example, the alarm period may have a duration of 5 minutes.

The alarm period of the battery capacity test may be coordinated with local emergency responders (e.g., fire and police departments) in advance so that response personnel are not dispatched to the monitored site unnecessarily. Likewise, the battery capacity test itself may be reported to the emergency responders as well as any central reporting service. If the monitored site is one in which a simulated alarm condition would be highly disruptive to occupants, the battery capacity test may be scheduled such that the alarm period occurs when the site is substantially free of occupants. For example, if the monitored site is a shopping mall, the battery capacity test may be scheduled such that the alarm period occurs when the mall is closed to the public. It is further contemplated that the alarm period may be entirely forgone, and that the standby period may instead be maintained for an additional amount of time (i.e., in addition to the required duration of the standby period) that is estimated to discharge the battery backups 25 by an amount that is substantially equivalent to the amount of discharge that would occur during an alarm period of required duration. Activation of the notification appliances 14 may thereby be entirely avoided.

At step 170, the test circuitry 30 of the alarm panels 14 may monitor the voltages and output currents of the battery backups 25 during the alarm period and may determine the capacities and discharge rates of the battery backups 25 in the manner previously described. The test software and test circuitry 30 of the alarm panels 14 may increase the frequency of voltage and/or output current measurements of the battery backups 25 during the alarm period relative to the standby period, especially when the voltage measurements drop below a level which indicates that the battery backups 25 are nearly completely discharged. This may provide greater precision in determining the state of battery health.

At the completion of the alarm period, the system controllers 27 may, at step 180, deactivate the notification appliances 12 (if actual alarming of the notification appliances 12 is initiated) and switch the alarm panels 14 back to their AC power sources 23, whereupon the battery capacity test is completed and normal operation of the alarm system 14 may be resumed. At step 190, the data derived from the voltage and current measurements of the battery backups 25 during the standby and alarm periods may be communicated to the workstation 16 and/or the offsite monitoring facility 20.

At step 200, the communicated data may be compiled into a comprehensive report that may be presented to appropriate personnel and/or stored for future review and comparison. The report may include information relating to battery capacity on record for each battery backup 25, as well as battery capacity consumed during the standby period and battery capacity consumed during the alarm period for each battery backup 25. The report may thus indicate the health and estimated capacity of each battery backup 25 in the system and may additionally refer to previous test results for comparison. This information may be used to schedule replacement of one or more of the battery backups 25. For example, if previous testing demonstrated that a particular battery backup 25 had 20% additional capacity (i.e., 20% capacity over and above the capacity required to provide power during the standby and alarm periods of the battery capacity test), and testing after one year demonstrated that the same battery backup 25 had only 10% additional capacity, it may be recommended that that battery backup 25 be replaced before the next annual test.

The system and method described herein thus facilitate convenient and cost-effective determination of the capacities of battery backups in an alarm system without requiring simultaneous observation and/or measurement of alarm system components and without requiring the battery backups to be removed from the alarm system.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The various embodiments or components described above, for example, the alarm system workstations, broker workstations, and the components or processors therein, may be implemented as part of one or more computer systems. Such a computer system may include a computer, an input device, a display unit and an interface, for example, for accessing the Internet. The computer may include a microprocessor. The microprocessor may be connected to a communication bus. The computer may also include memories. The memories may include Random Access Memory (RAM), Read Only Memory (ROM), and/or flash memory. The computer system further may include a storage device, which may be a hard disk drive or a removable storage drive such as a floppy disk drive, optical disk drive, and the like. The storage device may also be other similar means for loading computer programs or other instructions into the computer system.

As used herein, the term "computer" may include any processor-based or microprocessor-based system including systems using microcontrollers, reduced instruction set circuits (RISCs), application specific integrated circuits (ASICs), logic circuits, and any other circuit or processor capable of executing the functions described herein. The above examples are exemplary only, and are thus not intended to limit in any way the definition and/or meaning of the term "computer."

The computer system executes a set of instructions that are stored in one or more storage elements, in order to process input data. The storage elements may also store data or other information as desired or needed. The storage element may be in the form of an information source or a physical memory element within the processing machine.

The set of instructions may include various commands that instruct the computer as a processing machine to perform specific operations such as the methods and processes of the various embodiments of the invention. The set of instructions may be in the form of a software program. The software may be in various forms such as system software or application software. Further, the software may be in the form of a collection of separate programs, a program module within a larger program or a portion of a program module. The software also may include modular programming in the form of object-oriented programming. The processing of input data by the processing machine may be in response to user commands, or in response to results of previous processing, or in response to a request made by another processing machine.

As used herein, the term "software" includes any computer program stored in memory for execution by a computer, such memory including RAM memory, ROM memory, EPROM memory, EEPROM memory, and non-volatile RAM (NVRAM) memory. The above memory types are exemplary only, and are thus not limiting as to the types of memory usable for storage of a computer program.

The invention claimed is:

1. A system for testing battery backup capacity in an alarm system, the system comprising:
a panel;
a notification device operatively connected to the panel;
a battery backup associated with to the panel and configured to provide the panel and the notification appliance with electrical power;
a test circuit associated with the panel and configured to monitor a voltage and an output current of the battery backup during a battery capacity test; and
a system controller associated with the alarm panel and configured to determine, from the monitored voltage and output current of the battery backup, a capacity of the battery backup, the system controller further configured to execute the battery capacity test, whereby the alarm panel and the notification appliance are switched from a primary power source to the battery backup for a standby period of a first predetermined duration followed by an alarm period of a second predetermined duration, wherein the system controller activates the notification appliance during the alarm period.

2. The system of claim 1, further comprising a workstation configured to receive, from the system controller, information relating to the capacity of the battery backup and to compile the received information along with information relating to the capacities of other battery backups in the alarm system.

3. The system of claim 1, further comprising an offsite monitoring facility configured to receive, from the workstation or the system controller, information relating to the capacity of the battery backup and to compile the received information along with information relating to the capacities of other battery backups in the alarm system.

4. The system of claim 1, wherein the system controller is configured to terminate the battery capacity test and switch the alarm panel and the notification appliance back to the primary power source if at least one of the monitored voltage and the output current of the battery backup falls below an associated predetermined threshold value.

5. The system of claim 1, wherein the system controller is configured to automatically execute the battery capacity test according to a predetermined schedule.

6. The system of claim 1, wherein the system controller is configured to execute the battery capacity test upon manual initiation by an operator.

7. A method for testing the capacity of a battery backup in an alarm system, the method comprising:
switching an alarm panel and a corresponding notification appliance from a primary power source to a battery backup for a standby period of a first predetermined duration followed by an alarm period of a second predetermined duration, wherein the notification appliance is activated during the alarm period;

monitoring a voltage and an output current of the battery backup;

obtaining, from the monitored voltage and output current of the battery backup, information relating to the capacity of the battery backup; and compiling the obtained information relating to the capacity of the battery backup along with information relating to the capacities of other battery backups in the alarm system.

8. The method of claim 7, wherein the step of compiling the obtained information comprises communicating such information to a workstation remote from the alarm panel.

9. The method of claim 7, wherein the step of compiling the obtained information comprises communicating such information to an offsite monitoring facility remote from the alarm panel.

10. The method of claim 7, further comprising switching the alarm panel and the notification appliance back to the primary power source if at least one of the monitored voltage and the output current of the battery backup falls below an associated predetermined threshold value.

11. The method of claim 7, wherein the standby period comprises a first standby period of a first predetermined duration followed by a second standby period of a second predetermined duration, wherein the second predetermined duration is an amount of time that is estimated to result in a discharge of the battery backup by an amount that is equivalent to an amount of discharge that would occur during an alarm period having a third predetermined duration during which the notification appliance would be active.

12. The method of claim 7, further comprising determining which battery backups in the alarm system should be replaced based on the obtained information.

13. A method for performing an automatic battery capacity test in an alarm system in which a plurality of battery backups are configured to provide respective alarm panels and notification appliances with electrical power, the method comprising:

automatically switching the alarm panels and corresponding notification appliances from respective primary power sources to their respective battery backups for a standby period of a first predetermined duration followed by an alarm period of a second predetermined duration, wherein the notification appliances are activated during the alarm period;

automatically monitoring a voltage and an output current of each battery backup with test circuitry residing in each of the alarm panels;

automatically determining, from the monitored voltages and output currents of the battery backups, information relating to the capacities of the battery backups; and compiling the information relating to the capacities of the battery backups to create a report.

14. The method of claim 13, wherein the step of compiling the information relating to the capacities of the battery backups comprises commutating such information from each of the alarm panels to a workstation that is remote from the alarm panels.

15. The method of claim 13, further comprising switching the alarm panels and the notification appliances back to their respective primary power sources if the monitored voltage of one of the battery backups falls below a predetermined threshold voltage.

16. The method of claim 13, wherein the predetermined period comprises a standby period of a first predetermined duration followed by an alarm period of a second predetermined duration, wherein the notification appliances are activated during the alarm period.

17. The method of claim 13, wherein the standby period comprises a first standby period of a first predetermined duration followed by a second standby period of a second predetermined duration, wherein the second predetermined duration is an amount of time that is estimated to result in a discharge of the battery backups by an amount that is equivalent to an amount of discharge that would occur during an alarm period having a third predetermined duration during which the notification appliances would be active.

18. The method of claim 13, further comprising initiating the battery capacity test at a workstation that is remote from the alarm panels.

* * * * *